US008507876B2

(12) United States Patent
Goodman et al.

(10) Patent No.: US 8,507,876 B2
(45) Date of Patent: Aug. 13, 2013

(54) DEVICE FOR HOLDING ELECTRON MICROSCOPE GRIDS AND OTHER MATERIALS

(75) Inventors: Steven L. Goodman, Madison, WI (US); Jack LaSee, Abbotsford, WI (US); Mark T. Nelson, Marshfield, WI (US)

(73) Assignee: Microscopy Innovations, LLC, Marshfield, WI (US)

( * ) Notice: Subject to any disclaimer, the term of this patent is extended or adjusted under 35 U.S.C. 154(b) by 29 days.

(21) Appl. No.: 13/043,220

(22) Filed: Mar. 8, 2011

(65) Prior Publication Data
US 2012/0006711 A1    Jan. 12, 2012

Related U.S. Application Data

(60) Provisional application No. 61/311,702, filed on Mar. 8, 2010.

(51) Int. Cl.
*B65D 85/48* (2006.01)
*G21K 5/08* (2006.01)
*G21K 5/10* (2006.01)

(52) U.S. Cl.
USPC ............ 250/440.11; 250/442.11; 250/311; 850/18; 206/456

(58) Field of Classification Search
USPC ........ 250/310, 311, 440.11, 442.11, 492.21; 850/8, 16, 18; 206/456
See application file for complete search history.

(56) References Cited

U.S. PATENT DOCUMENTS

| | | | |
|---|---|---|---|
| 2,424,791 A * | 7/1947 | Bachman et al. | 250/311 |
| 3,344,662 A * | 10/1967 | Pruett | 73/860 |
| 4,297,010 A * | 10/1981 | Koehler | 353/122 |
| 4,672,797 A | 6/1987 | Hagler | |
| 5,753,924 A | 5/1998 | Swann | |
| 6,002,136 A | 12/1999 | Naeem | |
| 7,250,318 B1 | 7/2007 | Johnson et al. | |
| 7,544,953 B2 * | 6/2009 | Goodman | 250/440.11 |
| 7,663,101 B2 * | 2/2010 | Goodman | 250/304 |
| 7,700,917 B1 | 4/2010 | Galloway et al. | |
| 7,888,655 B2 | 2/2011 | van Gaasbeek | |
| 8,030,622 B2 | 10/2011 | Nishiyama et al. | |
| 2005/0107917 A1 * | 5/2005 | Smith et al. | 700/245 |

FOREIGN PATENT DOCUMENTS

| | | |
|---|---|---|
| JP | 2001084939 A | 3/2001 |
| WO | 9620495 A2 | 7/1996 |

OTHER PUBLICATIONS

International Preliminary Report on Patentability and Written Opinion; International Application No. PCT/US2011/027596; International Filing Date Mar. 8, 2011; Priority Date Mar. 8, 2010; Date of Mailing Oct. 18, 2011; 6 pages.

* cited by examiner

*Primary Examiner* — Bernard E Souw
(74) *Attorney, Agent, or Firm* — Cantor Colburn LLP

(57) ABSTRACT

A device for holding a specimen holder, the device including a body with a slot formed therein. The slot includes an interior for receiving the specimen holder which may be a flat disk with edges and a pair of opposing sides. The disk may be made of a resilient deformable material. The slot may be sized to receive the specimen holder through an open top end and may taper from top bottom, such that the bottom end of the slot is smaller than the specimen holder. The slot further configured to contact the specimen holder along edges of the specimen holder and to allow some sideways deformation of the specimen holder without either side of the specimen holder distant from the edges coming into contact with the interior of the slot.

22 Claims, 16 Drawing Sheets

FIG. 8
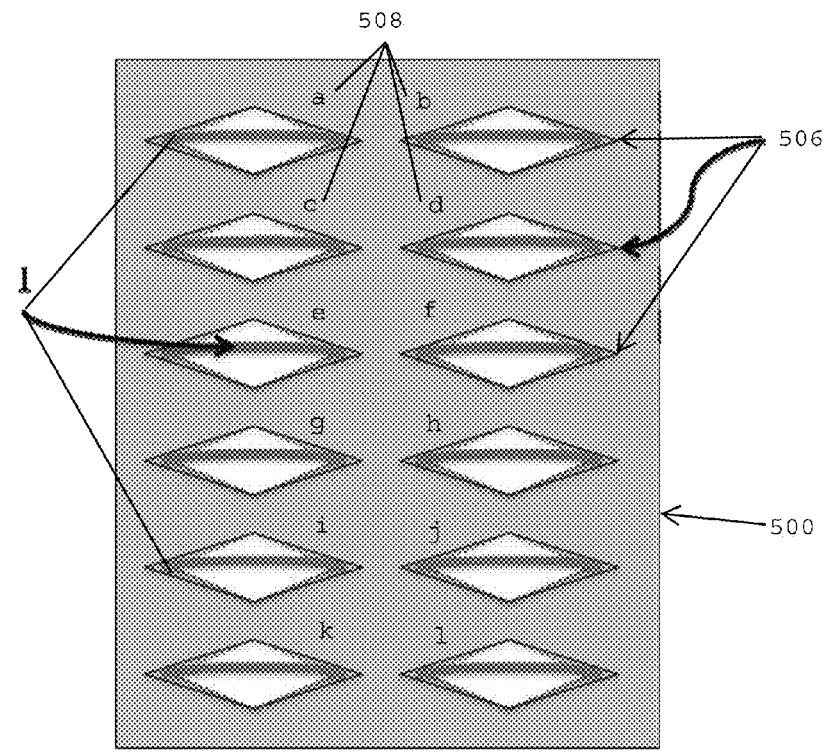
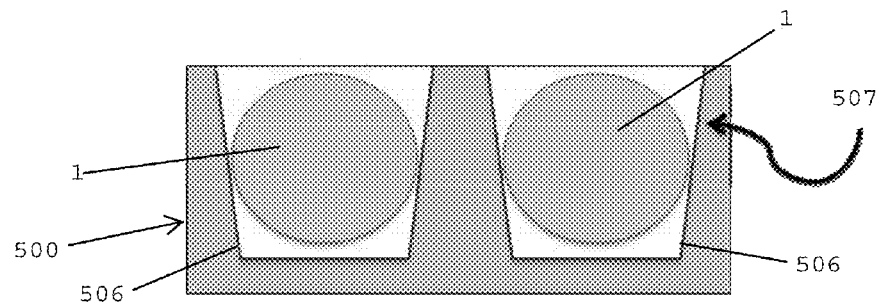
FIG. 9

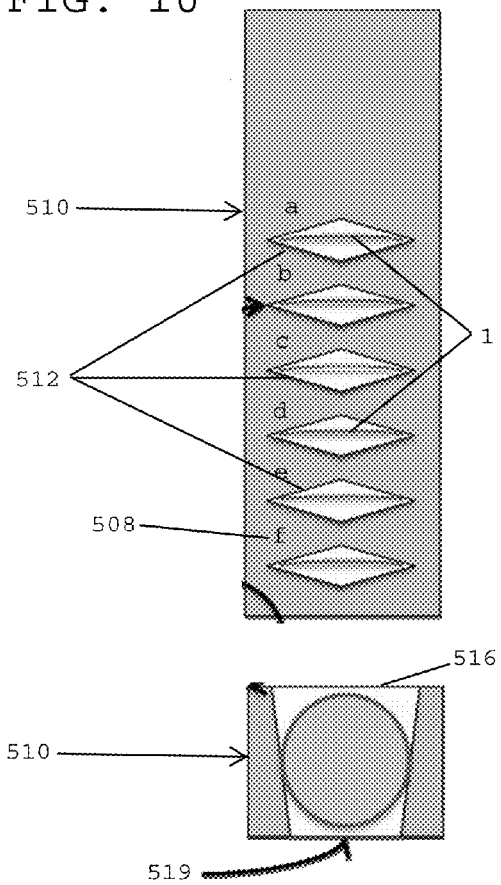
FIG. 10
FIG. 11
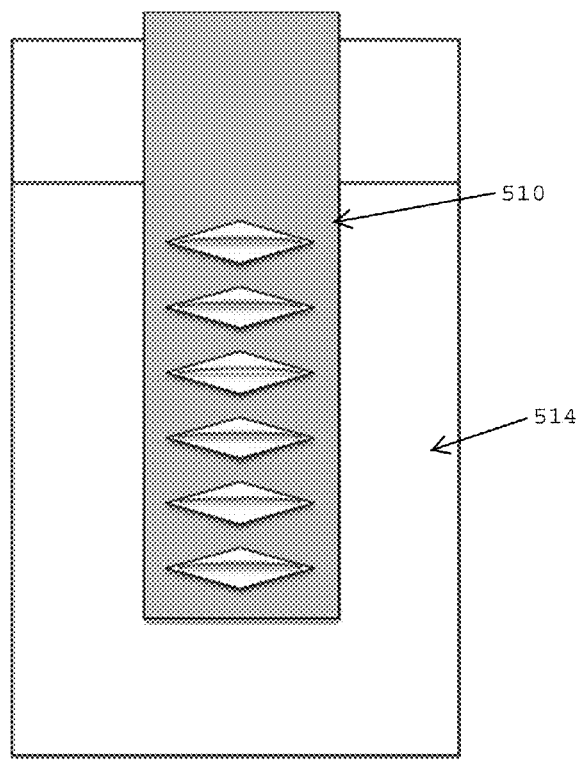
FIG. 12

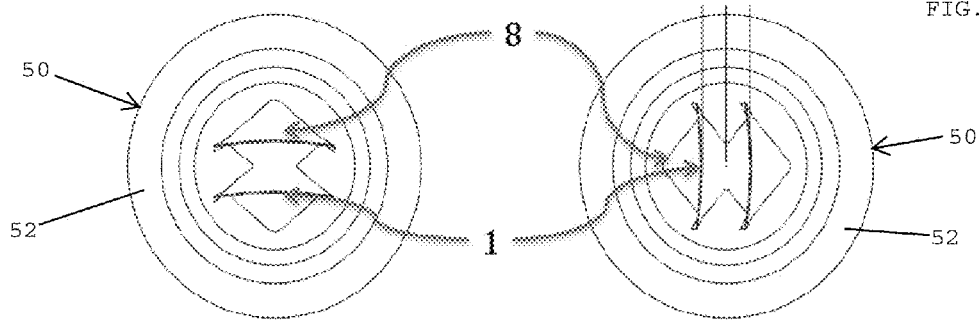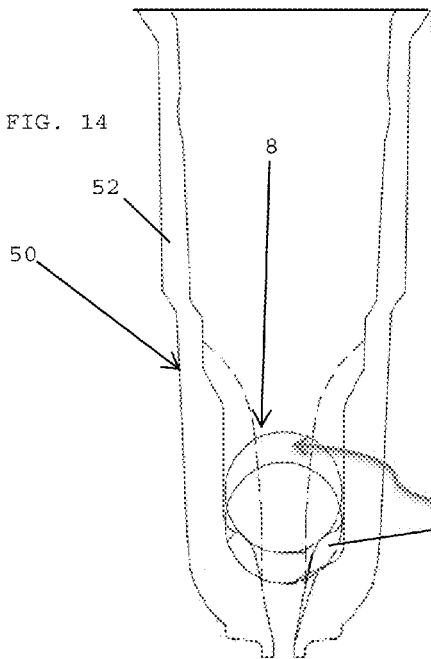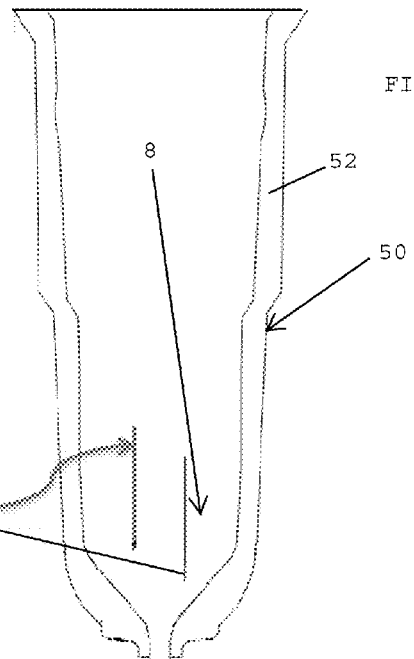

DEVICE FOR HOLDING ELECTRON MICROSCOPE GRIDS AND OTHER MATERIALS

CROSS-REFERENCE TO RELATED APPLICATIONS

The present application claims priority to earlier-filed provisional patent application Ser. No. 61/311,702, filed on Mar. 8, 2010, the disclosure of which is incorporated herein by reference in its entirety.

FIELD OF THE DISCLOSURE

This invention is generally directed to apparatus used to handle, prepare, process and archive specimens for electron microscopy supported on electron microscope grids. This invention has additional applications for holding similar size and shape articles including apertures used in scientific instruments and other articles.

BACKGROUND TO THE DISCLOSURE

Transmission electron microscopes (TEM) use a TEM grid to support specimens during imaging in the electron microscope, much as glass slides are used in light microscopes. TEM grids, generally referred to only as "grids," are also occasionally used in other applications. Standard TEM grids are 3.05 mm diameter disks of fine-mesh screen-like material, and are very thin, typically 30 μm to 100 μm thick. Most commonly, grids are made from, but are not limited to, Cu, Ni, Au, or NiCr alloy, but may also be made from other metals or for some applications may be polymeric, ceramic (e.g. silicon), or of special materials such as pyrolytic carbon, or still other materials. Some of the special grid materials can be thicker, such as about 200 μm thick for pyrolytic carbon.

Due to the need for grids to be very thin and for the screen to be a very open mesh, since it is through the openings that specimens are imaged, TEM grids are extremely fragile and easily damaged. Due to their small size, grids are very easy to lose if dropped or misplaced. Also, due to their very small size, it is not generally possible to mark or label individual grids to identify the specimen attached to them. Therefore, the identification of a grid, and the specimen it holds, is dependant on it being in a properly labeled location or container. Proper identification is essential when grids contain specimens from clinical patients, such as biopsies, or important research materials. Preparation of a grid with a specimen can often take several days of labor; hence loss or misidentification is very expensive in terms of time and effort.

Numerous types of storage containers are used to store grids. There are similarly also many devices used to treat the specimens on the grids. Both the storage devices and many of the processing devices, especially those that are intended to hold more than one grid at a time, provide indexed positions for individual grids. A device having multiple indexed locations to place grids for storage is called a grid box. Processing of grids commonly includes chemical stains or molecular labels to enable detection and localization of specific biological, structural, or chemical features. For biological specimens, especially, many solutions of stains and other chemicals are applied to the grid in liquids such as, but not limited to, water. Alternatively, in some processes, typically for non-biologic specimens, the stain or treatment may be applied as a vapor. In still others, the treatment, such as with ionized materials, may occur in a partial vacuum.

In many clinical or research labs it is not uncommon to need to process 10, 20, 30, or more grids at a time. Hence, devices that can perform simultaneous processing are desirable. Since many of the staining regents are toxic and/or are expensive, it is also desirable to minimize the consumption of these reagents.

All storage and processing devices require a means to hold and retain the grid in an identified indexed location. There are many devices and methods to hold grids in current use, for both storage and processing. In all current or conventional devices, the grid must be transferred from a storage device to a processing device or devices, and then back to a storage device. Additionally, in current or conventional devices, the grid must also be removed from the storage device and placed into the electron microscope for imaging. The major types of conventional grid holding devices are listed below. Also, briefly discussed are the principal limitations of these devices:

1. Referring now to FIGS. 1 and 2, a conventional Prior Art grid holder 100 is shown that is configured to hold a grid 1 for storage or processing entraps the grid in a slot. Conventional grid holders similar to grid holder 100 may be configured to include a single slot or a plurality of slots, with each slot configured to receive a single grid. The grid is conventionally enclosed on all except one side. Grids are conventionally held loose within slots 2, as shown in FIGS. 1 and 2. Most commonly the slot has a diamond or trapezoidal shape as viewed from the top that minimizes the contact of the grid faces with the wall of the slot, in order to avoid possible damage to the specimen, as shown in FIG. 1. The slot is conventionally rectangularly shaped when viewed from the side as shown in FIG. 2. To entrap a grid, the top of the slot may be closed with a close fitting sliding or rotating lid. In devices having multiple slots for receiving grids, the lid may be designed such that only a few grid slots are open at any time and not the whole holder. Such a lid is not shown in FIGS. 1 and 2.

a. Most grid boxes used for grid storage are opened with a sliding or rotating lid. When these are opened to access the grids, the loosely held grids sometimes pop out. This may occur due to static charge attraction or repulsion, or simply due to minimal mechanical jarring or jostling by the user. At times, more then one grid may pop out, and these grids may then become mixed up, so that identity is not clear. Even when a grid box is closed, grids can sometimes slip out of their slot since they are so thin, and then the grid may fall into a nearby slot. Thus, once again, the identity of the grid is not clear. This especially occurs when grid boxes are jostled, such as in routine transport; or it can occur due to static charge attraction of the grid to the grid box lid.

b. On occasion, conventional grid holders or grid processing holders of a similar configuration may be used to stain or process grids. When grids are stained or otherwise processed within such devices, generally with a liquid or sometimes a gas or vapor, the stain or other treating agent has limited circulation to the grid since flow is restricted due to the absence of flow-through circulation. Thus staining or other treatment often is uneven.

2. Some devices clamp grids with elastomeric polymer clamps. These are typically used for holding grids to enable immersion in staining solutions. Typically these are simply thin slits cut into an elastomeric material such as silicone rubber, polyurethane, or plasticized polyvinylchloride.

The grid is then partially inserted so as to have the clamping action hold the grid by its edge. This is not shown in the figures.
  a. The elastomeric clamping action can wear out, and is not always very secure. Chemical treatments with solvents and oxidizing reagents, commonly used in specimen preparation, can also cause elastomeric materials to break down and hence these devices can lose tension and thence release the grid.
  b. With many designs it is easy to accidently clamp onto the more central portions of the grid and hence damage the specimen that is located in the center region.
3. Forceps are commonly used to temporarily hold grids by clamping, preferably, onto the edge of a grid. Such forceps handing is used to move grids from one solution to another for processing. A common procedure is for users to place droplets of staining solution on a hydrophobic material (so that the droplets bead up) and then transfer the grids from droplet to droplet.
  a. It is difficult to handle multiple grids with forceps. In practice it is not uncommon to need to process a dozen or more grids at a time with droplet staining (or similar procedures). Such handling requires substantial practice and is very tedious, especially for those with less than perfect eyesight and/or coordination. Consequently, mix-ups and damage are always a concern and often a problem.
4. Magnetic holders are used in some devices wherein the grid is held in place with magnetic attraction.
  a. These devices are limited to use with paramagnetic grids, such as those made from NiCr alloys. However, this excludes the most common grids in use that are made from copper, and many other non-magnetic grid materials, thereby limiting the broad utility of such devices.
  b. Typically the magnetic holder is designed such that it contacts one entire side or face, or the majority of one side or face of the grid. Thus, if the grid is placed onto the holder in the wrong orientation the specimen may be damaged. Since specimens are ultrathin and often invisible to the naked eye, it is often difficult to know on which side the specimen is held.
5. Adhesives are used in some devices to hold grids. With one such device, the grids are stuck onto a stick that is inserted into liquids for processing.
  a. In practice, the adhesives have a limited useful lifetime.
  b. The adhesive may be affected by processing chemicals, such as solvents and oxidants, such that the adhesive can fail during use.
  c. Non-standard especially thick and stronger grids are recommended to prevent bending of the grid when removing from the adhesive coated device substrate. This limits the type of grids that may be used. Moreover, such thick grids are not desirable in some applications, such as tomographic imaging.
6. Grids are held by circular clamps or retaining rings after insertion into counter-bored holes in devices such as electron microscopes and various other instruments, such as vacuum instruments.
  a. These types of holders are very secure and may be designed to hold the grid flat for imaging. However, such grid holding devices are typically machined from high quality metal alloys and require complex manufacturing to produce. Thus, these are too expensive for use in storage containers and in many processing devices. These are generally only used in electron microscopes and some devices used to prepare specimens that require a vacuum.

SUMMARY

The present disclosure relates to a new type of "slot" that retains grids differently than all current holders. With this invention the slots are shaped so that edge of the grid becomes wedged into a slot. In this way the grid is tightly held and does not need a cover for retention. The grid is only held by the edges and near edge non-specimen containing regions, so that the specimen is not damaged while it is fully accessible for staining and other treatment. This enables this new type of slot to be used to retain grids for storage and treatment, or for microscope imaging. The new grid slot shape is also amenable to manufacturing processes including injection molding so that these may be produced in quantity. Finally, since the slot may be used for retention and processing, and even for microscope imaging, once a grid is inserted into such slots it is feasible to produce devices into which grids are inserted and where they remain for all processing and archiving steps, and even imaging steps, thus minimizing handling and the potential for loss or damage or mix-ups.

BRIEF DESCRIPTION OF THE DRAWINGS

The accompanying drawing figures, which are incorporated in and constitute a part of the description, illustrate several aspects of the invention and together with the description, serve to explain the principles of the invention. A brief description of the figures is as follows:

FIG. 8 is a top view of a second embodiment of a grid holder for multiple grids according to the present disclosure.

FIG. 9 is a side cross-sectional view of the grid holder of FIG. 8.

FIG. 10 is a top view of a third embodiment of a grid holder for multiple grids according to the present disclosure.

FIG. 11 is a side cross-sectional view of the grid holder of FIG. 10.

FIG. 12 is a view of the grid holder of FIG. 10 being used to immerse the grids held in a liquid or vapor bath in preparation for viewing or analysis.

FIG. 13 is a top view of a grid-holding pipette tube according to the present disclosure.

FIG. 14 is a side cross-sectional view of the grid-holding pipette tube of FIG. 13.

FIG. 15 is a second top view of the grid-holding pipette tube of FIG. 13, rotated ninety degrees with regard to FIG. 13.

FIG. 16 is a second side cross-sectional view of the grid-holding pipette tube of FIG. 15.

DETAILED DESCRIPTION

The present invention uses a new type of "slot" that retains grids differently than all current holders.

Figure 1:
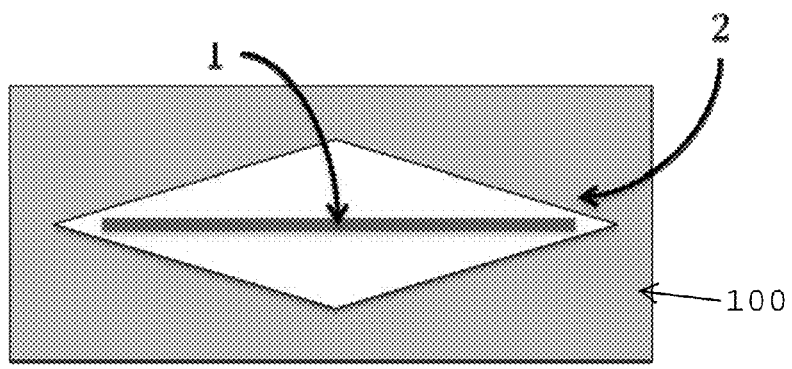
FIG. 1 is a top view of a prior art grid holder.
Figure 2:
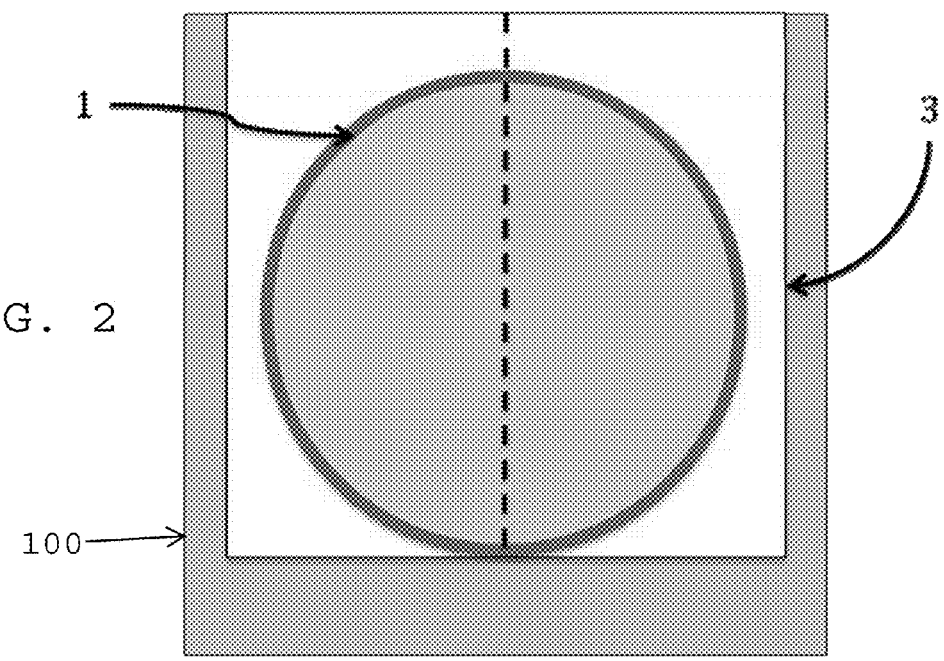
FIG. 2 is a side cross-sectional view of the prior art grid holder of FIG. 1.

FIGS. 1 and 2 illustrate the conventional approach to holding grids and have been described previously in the present disclosure.

Figure 3:
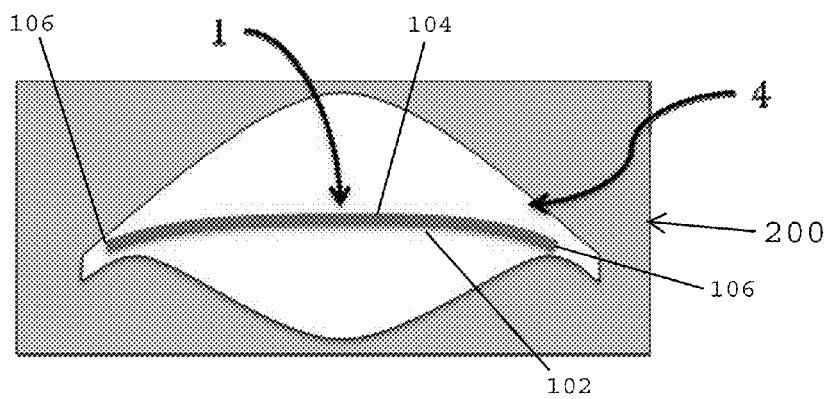
FIG. 3 is a top view of a grid holder according to the present disclosure.
Figure 4:
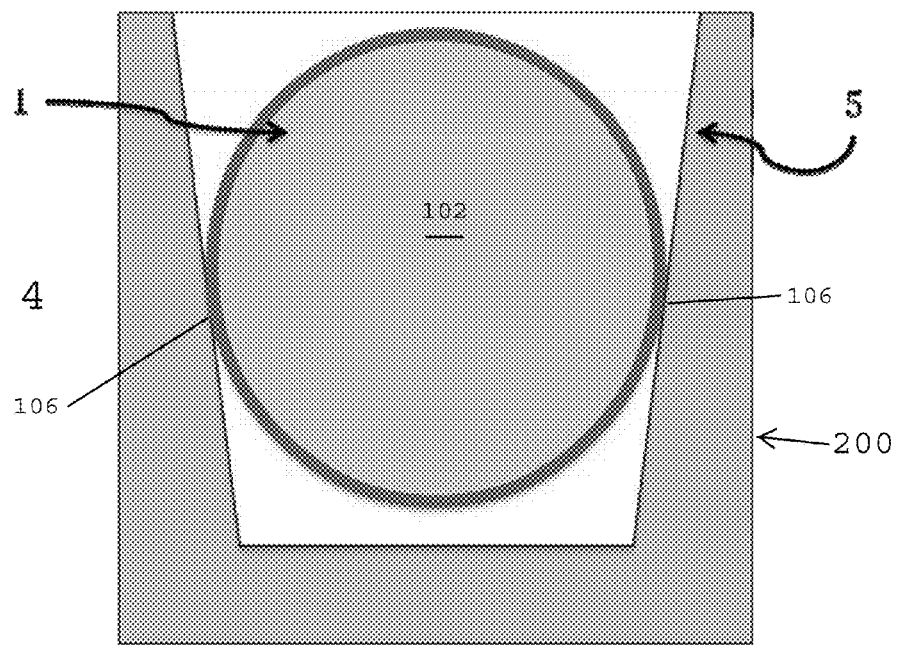
FIG. 4 is a side cross-sectional view of the grid holder of FIG. 3.

According to the present disclosure, a grid holding device 200 is shown in FIGS. 3 and 4. Grid holder 200 includes at least one slot 4 that may be shaped and dimensioned such that grid 1 may be forced to wedge and slightly bend in one axis, see FIG. 3. Grid 1 is shown as a TEM grid but may be any other suitable or similar device used to hold specimens for microscopic analysis. Alternatively it may be an aperture or other thin disk that requires such a holder. Grid 1 is illustrative only and it is not intended to limit the present disclosure to just pertaining to TEM grids. This shape and the forced bending of grid 1 to fit within slot 4 partially holds the grid firmly by one of inherent spring tension of the grid and/or the tension of the holder. Additionally, as shown in FIG. 4, slot 4 can also taper in width, with a top or entry end wider than a narrower bottom end with a slanted or angled edge 5 on opposite sides. The further the grid is inserted, the greater the curvature placed on the grid, and hence the tighter the grid is held. Grids of differing rigidity, or stiffness, or thickness are accommodated by inserting the grid into different depths into the holder. Similarly, grids of differing diameter are also accommodated, as are grids with tabs and half-grids such as are used for FIB lift out specimens.

Figure 5:
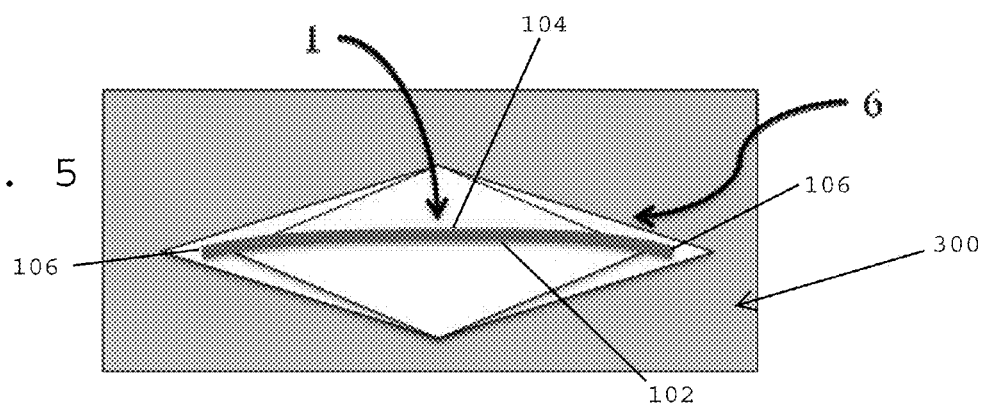
FIG. 5 is a top view of a first alternative embodiment of a grid holder according to the present disclosure.
Figure 6:
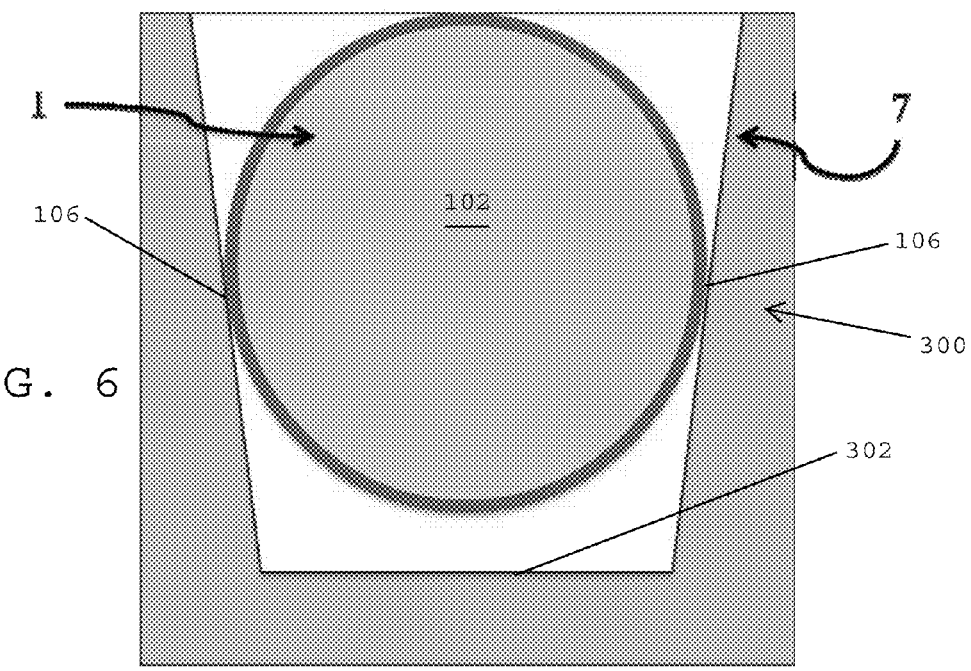
FIG. 6 is a side cross-sectional view of the grid holder of FIG. 5.

FIGS. 5 and 6 illustrate a second embodiment of a grid holder 300 with a trapezoidal slot 6 that tapers toward a bottom 302 of slot 6 with an angled sidewall 7. Grid 1 is held within slot 6 firmly along the edges with grid 1 deflected as shown in FIG. 5 while only the edges of the grid are in significant contact with any portion of an inner wall of slot 6.

The slots hold grids securely; yet also enables ready removal of the grid with forceps, as is standard practice with most grid holders.

Grid 1 is held within grid holders 200 and 300 only on edges 106 adjacent sidewalls 5 and 7, respectively, and a portion of backside or face 102 of grid 1 near the edges as shown in FIGS. 3 and 5, and the grid is not touched on a specimen side or face 104. In this preferred arrangement, specimen side 104 is arched outward by the deflection of grid 1 and held away from contact with any of the inner walls of either slot 4 or 6. Thus, specimen side 104 is free for media access on both faces. If the grid is inserted in the "wrong" direction, so that the specimen face is arched towards an inner wall grid holder 200 or 300, this causes no harm since the inner wall of the grid holder would only touch a very small portion of specimen face 104 of grid 1 very near edges 106; hence, the specimen in a center region of the grid would be untouched away from the edges.

The bend imparted on the grid is very slight and is typically much less than that which typically or conventionally occurs with normal forceps handling of a specimen grid. Thus, there would be no damage to the grid or the specimen attached to the grid. The extent of the bend is also under the control of the user. With stiff grids almost no bend occurs, or a grid may be simply wedged in place, or instead of the grid bending the grid holder itself bends or flexes.

Figure 7:
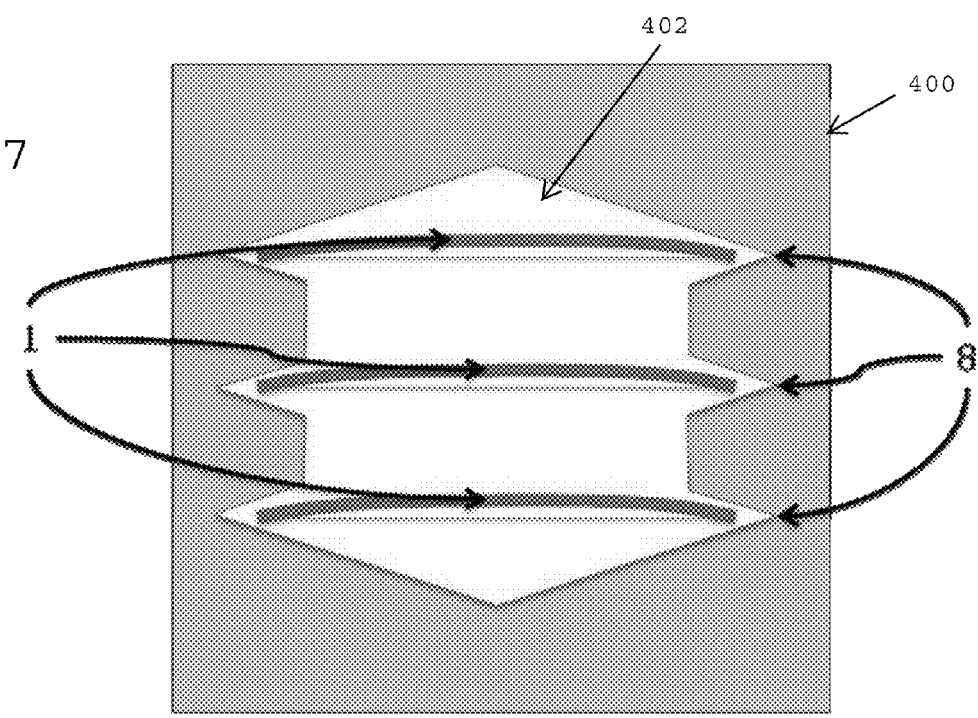
FIG. 7 is a top view of a grid holder for multiple grids according to the present disclosure.

As shown in FIG. 7, an alternative grid holder 400 may be configured to hold one or multiple grids 1 within slots 8 formed within a larger opening 402 that completely encircle or surround each grid. This facilitates the delivery of fluidic or other reagents to each grid, and also reduces the amount of material needed to hold several grids.

Referring now to FIGS. 8 and 9, a grid holder 500 may be configured with many individual slots 506 having tapered side walls 507. Grid holder 500 may be used as a storage device to isolate and hold grids 1 for storage or to permit multiple grids to be stored in a single grid holder without the grids coming into close proximity to each other. Each grid accepting slot may be marked with indicia or some other indexing or identification approach (not shown on figures). The slot type shown in FIGS. 3 and 4 may alternatively be used for a grid holder like that illustrated as grid holder 500. Grid holder 500 may also include indicia 508 adjacent each slot to permit identification of the grid within that slot.

A further alternative embodiment of a grid holder 510 according to the present disclosure is illustrated in FIGS. 10 to 12 with a plurality of slots 512 each configured for holding a single grid 1. Each grid accepting slot being marked or indexed to permit identification of the slot and/or the grid within the slot, indicated in FIG. 10 as indicia 508. Slots 512 may be configured to be open from both top 516 and bottom 519, thus enabling excellent access to the grid, and the specimens attached to the grid, by processing chemicals. With grids 1 held within slots 512, grid holder 510 could be immersed within a liquid or vapor bath 514 to permit all of the grids and any specimens attached to the grids to be treated or processed. The slot type shown in FIGS. 3 and 4 may alternatively be used for a grid holder like that illustrated as grid holder 510. Alternatively, the slot type shown in FIG. 7 also be used for a grid holder like that illustrated as grid holder 510.

The grid holder and/or the various holding slots may be made in any desired material, including polymers, metals, or ceramics. There is no need for an elastomer to grip the grids, nor an adhesive. Thus, chemically resistant materials may be readily used.

This new type of holding slot may be readily manufactured in high quantity and quality by injection molding. Slots may be made from injection-molded polymers including polypropylene or polyethylene for easy of mass fabrication, and for good chemical resistance. While not elastomers, these materials nonetheless can exert some pressure on the grids to better hold them in place. Thus, the slot provides some of the tension to hold the grid, rather than the grid providing the tension. Slots can be made of many other materials including, but limiting to, fluoropolymers, other thermoplastic polymers, thermoset polymers, metals, injection molded metals, and ceramics. Other similar materials may be used to form or construct grid holders according to the present disclosure and it is not intended to limit the specific materials from which the grid holders may be made.

FIGS. 13 to 16 illustrate a grid holding micropipetting (GHMP) device 50 according to the present disclosure. GHMP 50 includes an open topped body 52 within which are located two slots 8 configured to retain grids as described herein. Note that while other illustrations have shown the slots are being essentially side-by-side, it is not intended to limit the present disclosure to such arrangement of slots. As illustrated in FIGS. 13 to 16, slots 8 of GHMP 50 are offset vertically from each other.

Figures 17, 18:
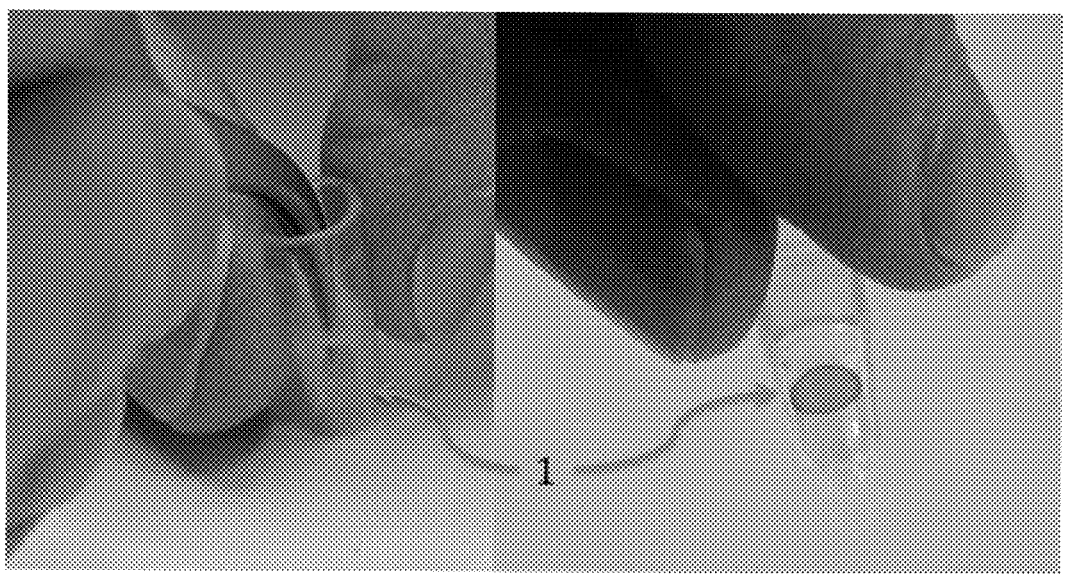
FIG. 17 is a photograph of a grid being inserted into the grid-holding pipette tube of FIG. 13.
FIG. 18 is a photograph of the grid-holding pipette tube of FIG. 17 with a grid inserted within the tube. Note that the angle of observation and the lens effect of the shape of the tube may combine to make the round grid appear oval.

FIGS. 17 and 18 illustrate a user placing a grid into a device similar to GHMP 50 using a forceps, which would be a common procedure for positioning a grid.

Figure 19:
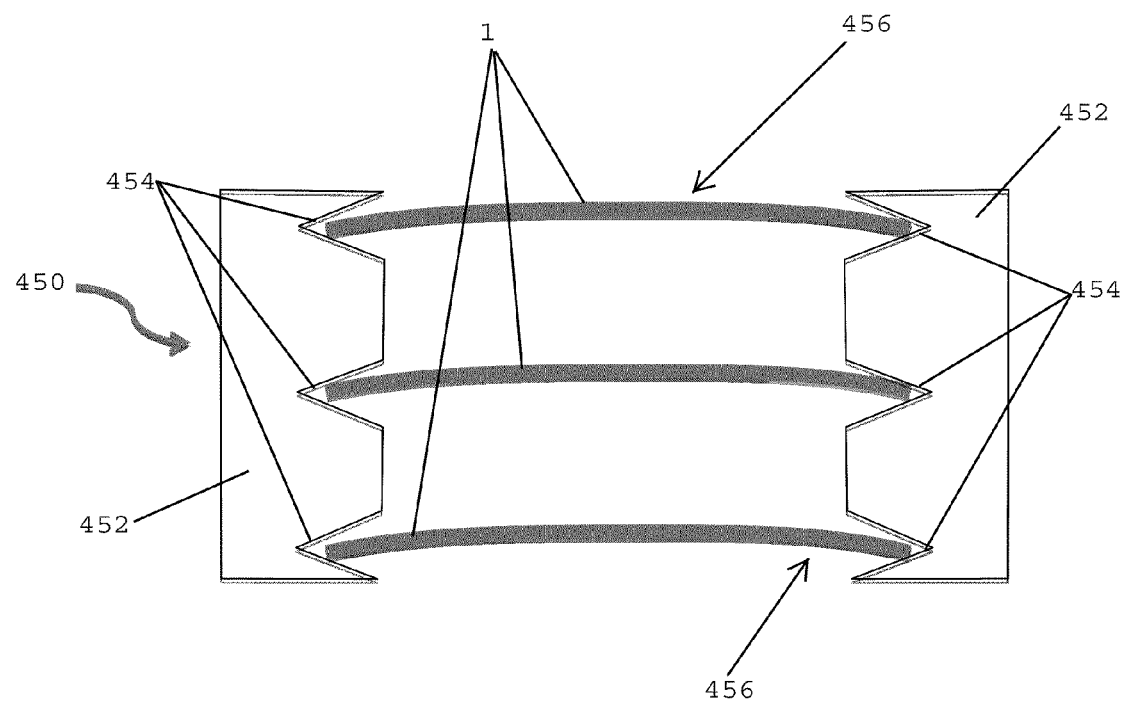
FIG. 19 is a top view of a further alternative embodiment of a grid holder according to the present disclosure that is similar to the grid holder of FIG. 7, wherein the grid holder is comprised of a pair of opposing walls into which partial slots are formed to receive the grids.

FIG. 19 illustrates a grid holder 450 according to the present disclosure. Grid holder 450 is comprised of a pair of opposing side walls 452 into which a plurality of corresponding recesses 454 may be formed. Each corresponding pair of recesses 454 may define a grid receiving slot 456. Into each slot 456 a grid 1 may be placed in a manner as described herein. What primarily distinguished grid holder 450 from grid holder 400 is that grid holder 450 may have opposing walls 452 mounted to any suitable surface to permits the appropriate spacing of the walls. It is not necessary that the slots be formed en bloc or as an integral part of a larger grid holder, rather, the grid holder may be formed an positioned on any appropriate mounting surface where the securing of grid specimens is desired. While grid holder 450 is shown herein with a TEM grid, it is anticipated that grid holder 450 may also be adapted for use with FIGB> grids, as described below with regard to FIGS. 26 to 30.

Figure 20:
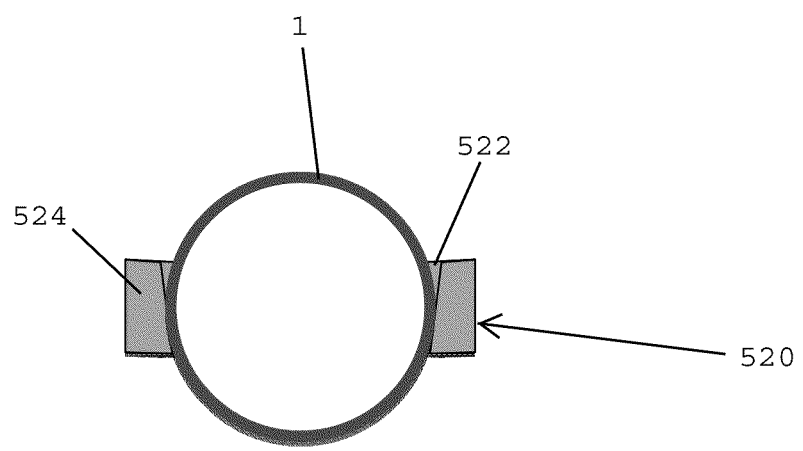
FIG. 20 is a cross-sectional side view of a further alternative embodiment of a grid holder according to the present disclosure which is similar to the grid holder of FIGS. 10 and 11, with the grid holder having a body with a thickness less than the size of the grids being held.
Figure 21:
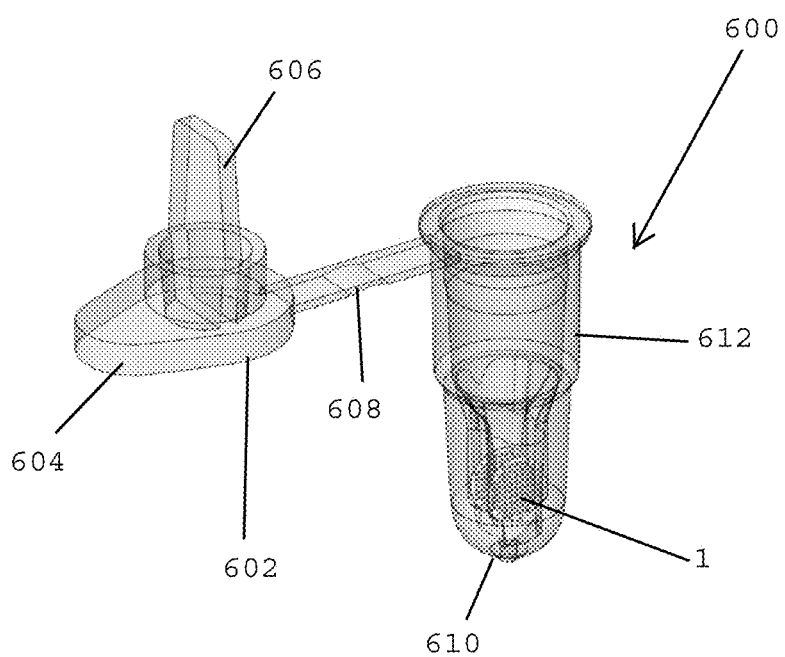
FIG. 21 is a perspective view of a grid holding capsule according to the present disclosure.

FIG. 20 illustrates a grid holder 520 with a slot 522 formed therein for receiving a grid 1. Grid holder 520 is similar to grid holder 510 with the primary difference being that grid holder 520 is configured so that a body 524 of grid holder 520 is not as thick as the diameter of the grid being held. The thickness of the grid holder is compared to the diameter or size of the grid along a plane of insertion of the grid into the slot. Thus, grid 1 within slot 522 may extend either above or below body 524 outside slot 522, or grid 1 may extend both above and below the body.

FIGS. 21 to 25 show a one-piece grid holding capsule 600 according to the present disclosure. Capsule 600 may have a cap 602, shown in an open position. Cap 602 may have an extended lip 604 that provides a place for users to grip the cap for opening and closing. The top of the lip, when the cap is closed, may have a roughed texture to provide a better finger or thumb grip. Cap 602 may include a tongue 606 that, when closed, extends into the capsule. The cap may be connected to capsule 600 with a flexible "living" hinge 608. The asymmetry of the capsule 600 due to the cap 602 and the hinge 608, provides a feature that enables each grid slot to be identified from the other, thus providing an index for which grid slot is which. The grid slots may also be indexed by markings placed on the hinge 608 (markings not shown), or markings placed elsewhere on the capsule 600.

Figure 22:
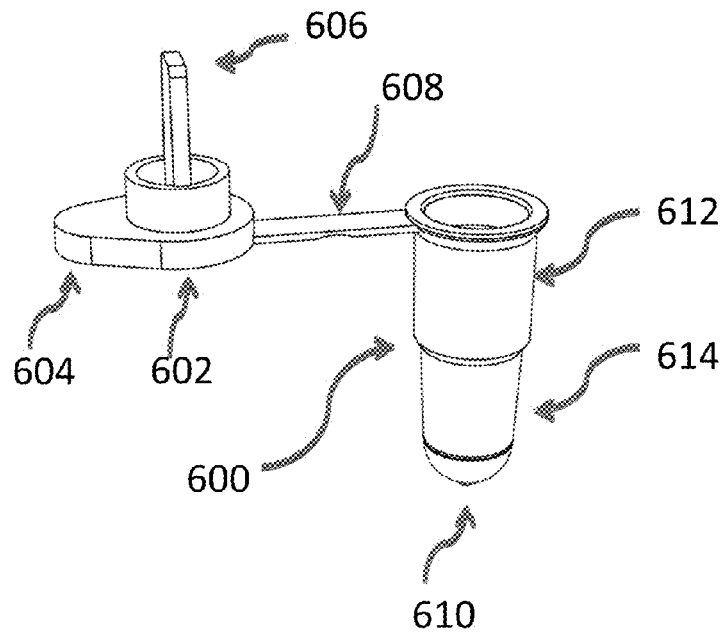
FIG. 22 is a side view of the grid holding capsule of FIG. 21.

FIG. 22 also shows an orifice in bottom 610 for fluids to be drawn into the capsule or expelled. The approximately top half of the capsule 612 may have an internal taper and dimensions (also shown in cross-sectional FIG. 23) to connect to a displacement pipette apparatus. The approximately lower half portion of the capsule may have an external taper and dimensions 614 to enable insertion into a second capsule 600, or a conventional pipette tip (also shown in cross-sectional FIG. 23).

Figure 23:
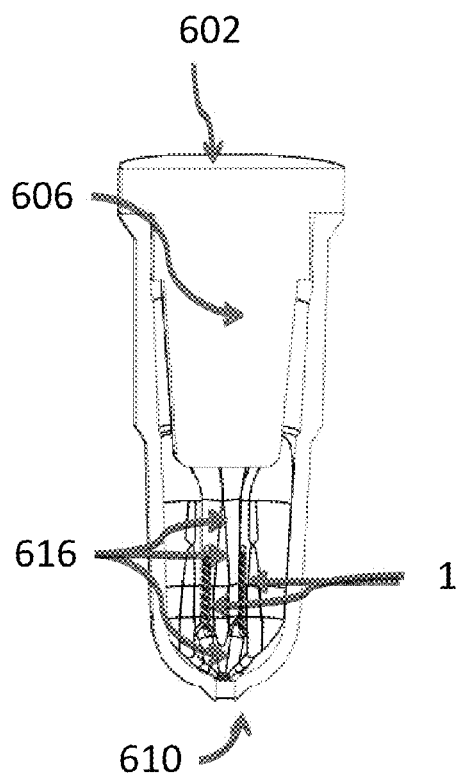
FIG. 23 is a side cross-sectional view of the grid holding capsule of FIG. 21.

FIG. 23 illustrates grid holding capsule 600 with cap 602 in the closed position. Tongue 606 extends deep into the capsule so that it is at the top of the grid slots 616 to prevent grids 1 from sliding out of their slots. Slots 616 extend all the way to the orifice 610 to provide good drainage of fluids.

Figure 24:
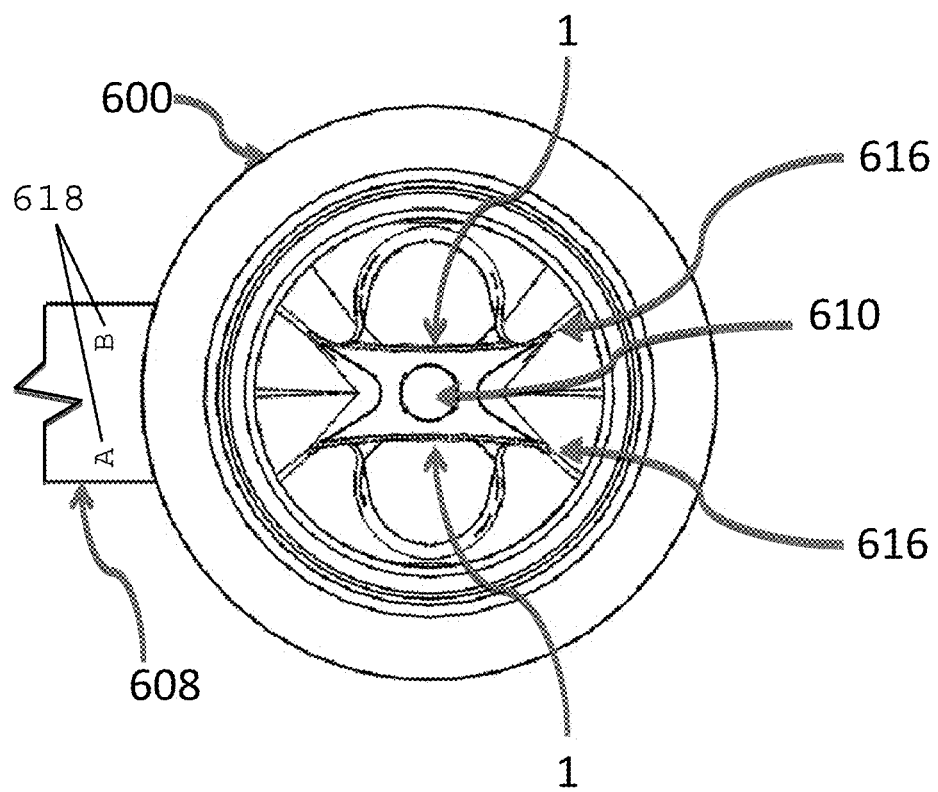
FIG. 24 is a top view of the grid holding capsule of FIG. 21.

FIG. 24 shows a top view of grid holding capsule 600. Two grids 1 are shown inserted into the slots 616. The orifice 610 is at the bottom of the capsule and a portion of the hinge 608 is shown connected to the main body of the capsule 600. Capsule 600 may also include indicia 618 on the capsule corresponding to the slots within the capsule to ensure for ready and sure identification of the slots or the grids within the slots.

Note—The grids are held only by the edges and a small part of the face of the grid very near the edge. Also note that there is very open fluid access on both faces of both grids. Note that the grid slots shown in FIGS. 21 to 25 are different from the grid slots of device 50 in FIGS. 13 to 16. But the grid slots in both FIGS. 21 to 25 and FIGS. 13 to 16 share the grid-holding features in that they both hold grids from the edges and very near the edge, and provide very open fluid access to both faces of both grids.

Figure 25:
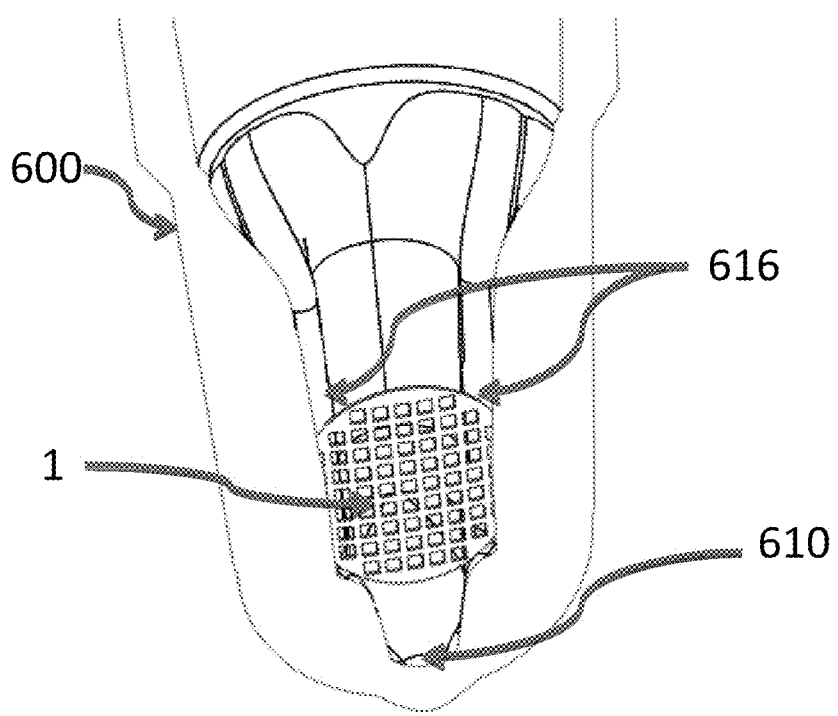
FIG. 25 is a lower perspective cross-sectional view of the grid holding capsule of FIG. 21.

FIG. 25 is a cross-sectional view of the lower portion of grid holding capsule 600. A single grid 1 is inserted into one of the slots 616 which obscure or hide the edges of grid 1. Slots 616 taper from the top to the bottom so that the farther a grid 1 is inserted the more it is wedged into place. The inside of the drainage orifice 610 is shown.

Note—While FIGS. 21 to 25 and FIGS. 13 to 16 show capsules that hold two grids, the present invention is not limited to capsules holding 2 grids. Capsules may be formed to hold 1 grid only, or 3 grids, or more than 3 grids.

Another application of the grid holding invention are specialized holders that hold grids during manipulation processes used to prepare specimens for imaging, and to then retain the grids in the holder during subsequent imaging and storage. These holders are intended for specimen preparation process that typically utilize focused ion beam (FIB) mill specimen preparation instrumentations, and are commonly used for preparing materials science, micro-electronics and nanotechnology specimens, and to a lesser extent for the preparation of life science specimens. With FIB specimen preparation processes, a small specimen for TEM or other microscopic analysis is typically removed from a larger bulk material using the FIB instrument, which comprises a focused ion beam to mill selected regions of specimen and micro-manipulation tools to move objects, all within the vacuum chamber of a scanning electron microscope. The small specimens thus prepared are typically less than 1-2 microns in at least one dimension, and often in two ore even three dimensions. FIB prepared specimens are then usually mounted onto a special TEM grid typically called a FIB grid. Once mounted onto the FIB grid the specimen may be further manipulated or processed prior to imaging with a TEM or similar microscope, or sometimes an SEM, or sometimes other microscopes or analytical instruments. FIB grids are usually the same 3.05 mm diameter of conventional grids but they are even more fragile than conventional TEM grids since they comprise only about ⅔ of the 360 degree full circle disk of a conventional grid. FIB grids are thus even more difficult to handle since they have less available portions for holding and clamping than do conventional grids.

The present disclosure provides the tight grid holding technology to provide apparatuses that hold FIB grids during most, if not all, specimen preparation processes, specimen imaging, and specimen storage. Thus, when secured according to the present disclosure, the fragile FIB grids require almost no individual handling and thus the potential for damage, or the potential for loss since FIB grids are very small, is greatly reduced. With the current disclosure, FIB grids would be loaded into the holder prior to use. The holder with FIB grids would then be inserted into the FIB instrument. Specimens would then be prepared and mounted onto the FIB grids, and further processed as required. The grid holder with FIB grids and specimens would then be removed from the FIB for any further processing, and for storage. The grid holder with FIB grids and specimens is then mounted onto a second holder that enables the entire apparatus to be inserted into a transmission electron microscope, or into other analytical instruments or microscopes, or into another preparative apparatus or instrument for further specimen manipulation or processing.

Figure 26:
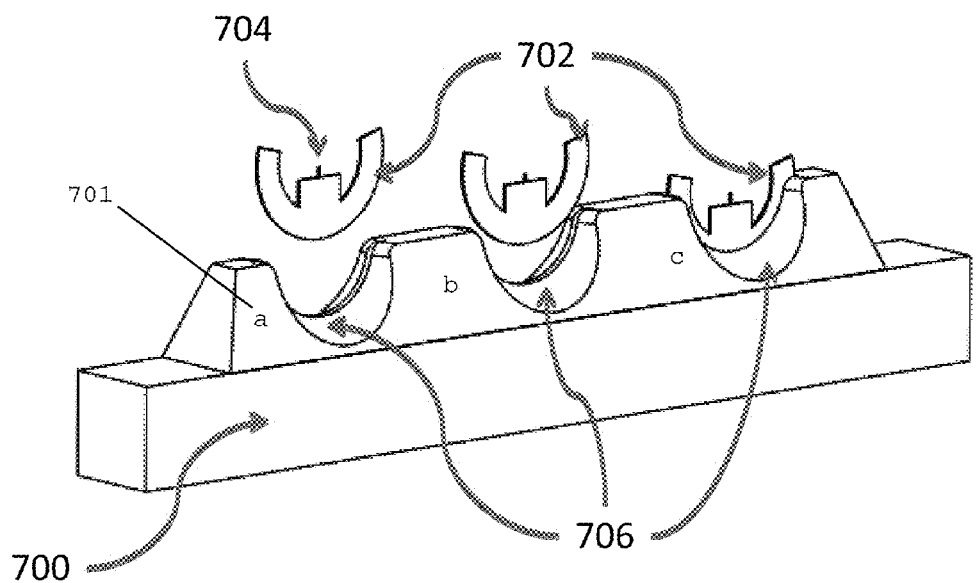
FIG. 26 is a perspective view of a grid holder according to the present disclosure with FIB grids in various stages of being loaded into the holder.

FIG. 26 is an oblique view of the FIB grid holding apparatus 700 intended for holding 3 FIB grids 702. One FIB grid 702 is shown fully inserted into a grid holding slot 706, while two other FIB grids 702 are shown above the slots 706. While the configuration allowing 3 grids to be held is shown, grid holders for FIB grids according to the present disclosure may be made in versions to hold other numbers of grids. Each grid accepting slot being marked or indexed for identification of the grid or slot by any number of standard or accepted marking schemes (not shown on figures). Grids 702 shown are so-called FIB or Focused Ion Beam grids that are typically used to support specimens 704 that are micro-machined using a focused ion beam instrument. The grid holding slots 706 may be of the wedge-fit shapes as shown in the FIGS. above, except that the slots may be shorter than the grid diameter. While FIG. 26 shows the apparatus holding FIB grids, other types of grids may also be held. FIG. 26 also shows that grid holder 700 may include indicia 701 corresponding to the various slots so that grids within those slots may be identified.

Figure 27:
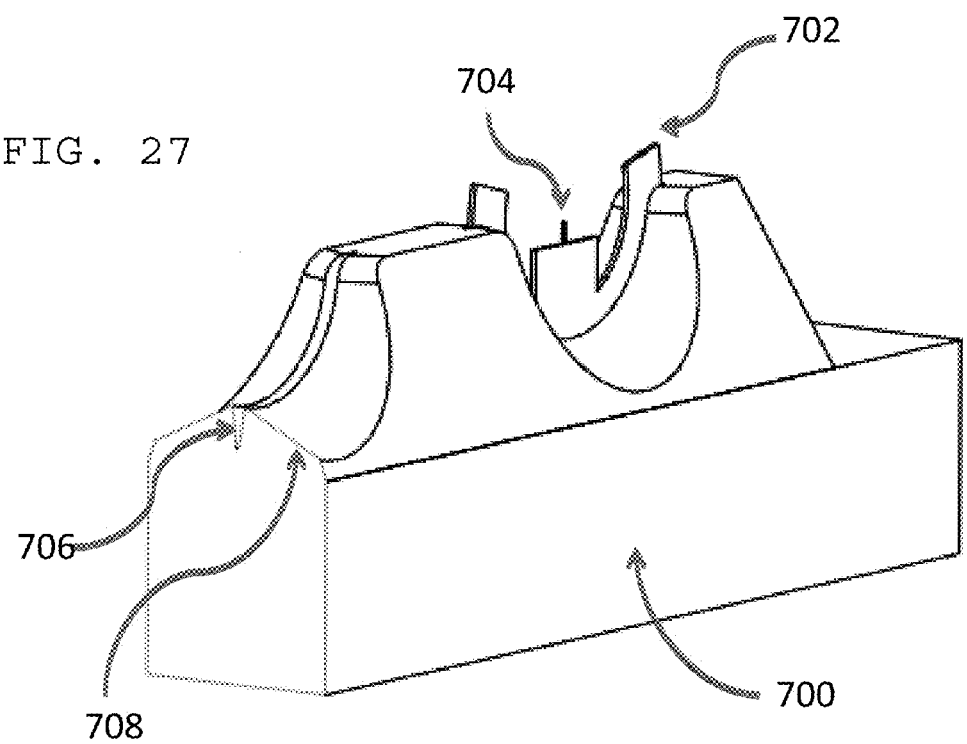
FIG. 27 is a closer cross-sectional perspective view of a portion of the grid holder of FIG. 26.

FIG. 27 is a cross-sectional oblique view of the FIB grid holder 700, and shows a cross-section of the a grid slot 706. A region 708 surrounding the FIB grids 702 may be angled away from the central axis of the grid in order to maximize access to the grid 702 and specimen 704 for manipulation tools and microscopic imaging.

Figure 28:
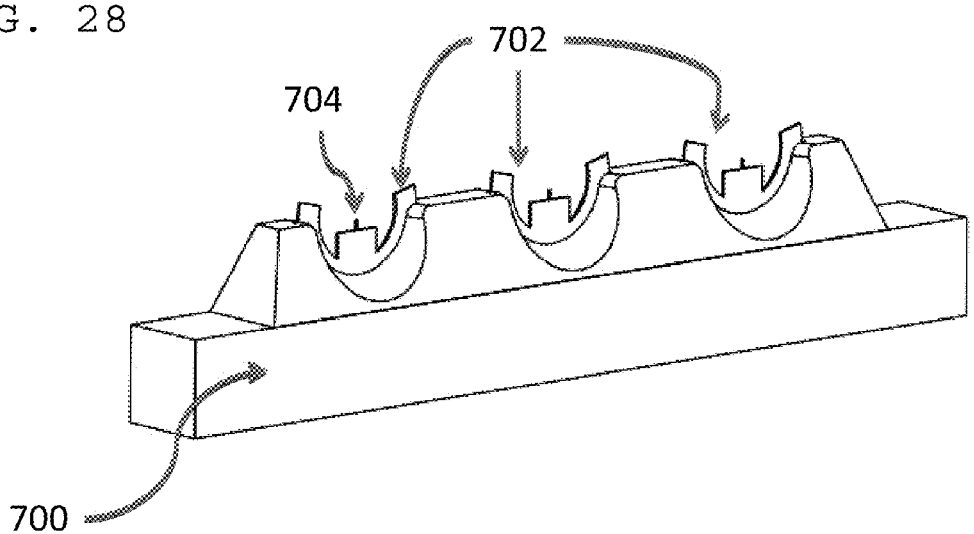
FIG. 28 is a perspective view of the grid holder of FIG. 26, with the FIB grids loaded into the holder and the grid holder laid on its side.

FIG. 28 is an oblique view of the grid holder 700 with 3 FIB grids 702 mounted into grid slots 706 with the grid holder in an upright orientation. This upright orientation of the grid holder may be used for inserting grids, and if removing grids (if it is desired to remove grids from the apparatus), for storage of the entire grid plus apparatus assembly within a suitable sealed container, and is especially useful for holding grids while mounting specimens 704 on grids 702 and otherwise manipulating specimens in a focused ion beam apparatus, or performing other manipulations, or for imaging with a scanning electron microscope or other instruments.

Figure 29:
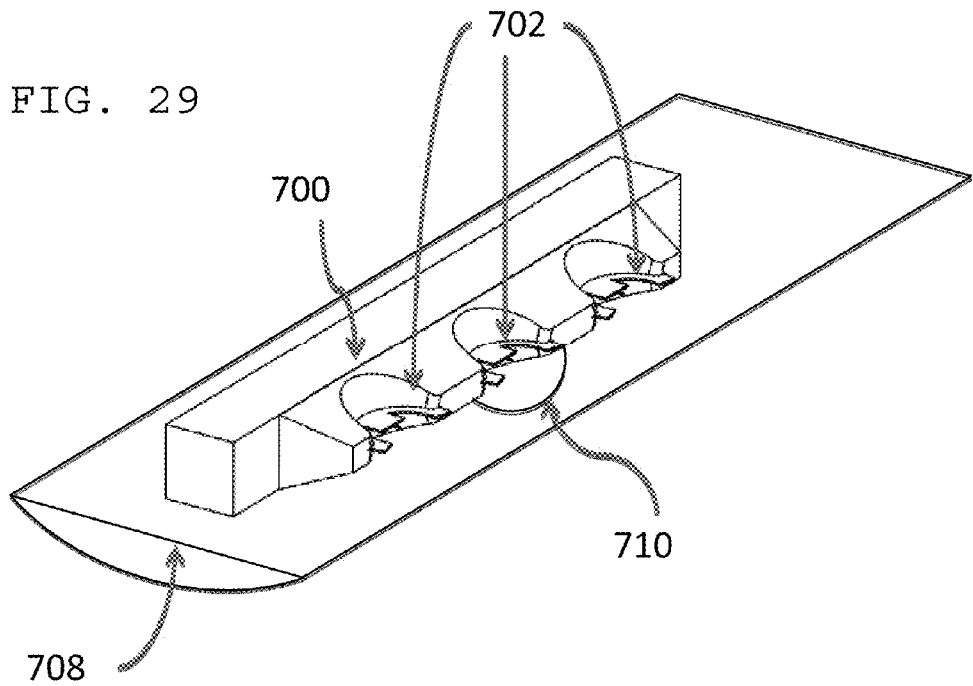
FIG. 29 is a perspective view of a second embodiment of an FIB grid holder according to the present disclosure and shows a specimen insertion rod.

FIG. 29 is an oblique view of the grid holder 700 with 3 FIB grids 702 mounted into grid slots 706 with the grid holder in a sideways orientation. This sideways orientation of the grid holder may be used for holding grids for imaging within a transmission electron microscope. Grid holder 700 may be mounted on an appropriately equipped specimen insertion rod 708, and may be moved to and fro along the axis of the specimen insertion rod to align specimens over one or more holes 710 in the rod so that transmission electron microscope images may be obtained.

Figure 30:
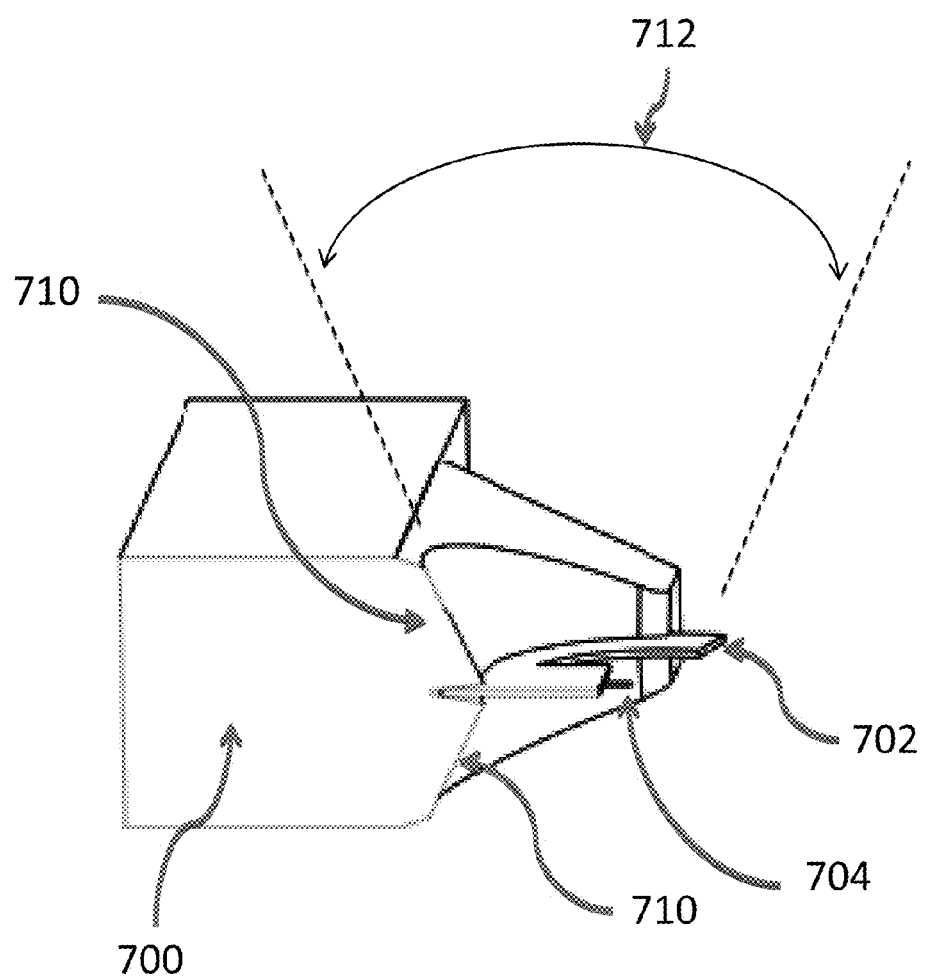
FIG. 30 is a closer cross-sectional perspective view of the FIB grid holder of FIG. 29 without the specimen insertion rod.

FIG. 30 is a cross-sectional oblique view of grid holder 700, oriented sideways for imaging in a transmission electron microscope. FIB grid 702 is shown in cross section with a specimen 704 mounted on the FIB grid. Region 710 surrounding the grid 702 may be angled away from the central axis of the specimen 704. This provides a very larger angle of view 712 for microscope imaging of the specimen 704.

Applications of the Disclosure

The grid holder of the present disclosure may be used in many different types and configurations of devices to hold grids for storage and/or processing, or to hold grids during electron microscope analysis, or for some other purposes as described:

1. The slot shape can be used in grid boxes and archiving holders, such as grid holder 500 as shown in FIGS. 8 and 9. Since the grids are not free to move about within the slots, there is little chance of grids falling out of the slot when such grid boxes are opened, and even less when such grid boxes are closed. No cover is shown on the box in the figure, but a cover may be desirable to provide additional protection and to maintain cleanliness.

2. This slot design may be used in devices that hold multiple grids such as a linear tube holder such as those described in Goodman SL, 1981, A Pipetting Device for Staining Electron Microscopic Grids. J. Microscopy: 123, 329-331. Such slots can also be incorporated into rods, sticks, capsules, or other configurations, to enable immersing the grid holder with grids into processing fluids, gases, or other environments. See FIGS. 10 to 12.

3. Grid processing devices that enable ready processing, excellent flow-through reagent access, and ease of use are discussed in some detail in U.S. Pat. No. 7,544,953. The slot design of the current disclosure can be readily incorporated in these sorts of devices, such as the GHMP described therein. This is shown in FIGS. 13 to 18 and in FIGS. 21 to 25.

4. The slot shape can be used to hold grids for analysis in microscopes. Since the holder slots can be made from metals this provides strength, rigidity, and vacuum cleanliness.

5. The slot shape can be used to hold grids for processing devices in materials science specimen preparation, such as in devices that perform plasma treatment, and others processes or treatments. Since the holder slots can be made from metals this provides strength, rigidity, and vacuum cleanliness, should this be needed.

6. The slot shape can be used to hold apertures since these are often similar to grids. Apertures used in many scientific instruments and some consumer devices are typically formed of thin sheets of metals, ceramics, or other materials with carefully prepared holders. Such apparatus are commonly used in optical and electron optical instruments, devices, and other applications. Since the holder slots can be made from metals this provides strength, rigidity, and vacuum cleanliness, should this be needed.

7. The slot shape can be use to hold other disk-shaped items where the combination of features provided is useful or advantageous. Examples of such uses may include but are not limited to, oval shaped objects or really any object shaped with opposing arched sides where it is desired to retain the object without substantially touching or engaging either or both of the opposing faces of the object. Such objects may include but are not limited to items held for plating, objects being subjected to exposure to a cleaning solution, lenses being exposed to gas deposition coatings, circular or oval lenses for lighting fixtures that are being held for sandblasting or chemical or mechanical etching, fragile plates being secured for transport and/or storage, and industrial components being held for painting, powder coating, vacuum treatments, or other types of surface deposition techniques.

Features of Grid Holder According to the Present Disclosure

Grid holder according to the present disclosure may have one or more of the features selected from the following non-limiting list:
1. The slot is very open thus enabling excellent access of the grid, and the specimens attached to the grid, to processing chemicals or other treatments.
2. The slots are shaped and dimensioned such that grids are forced to wedge and slightly bend in one or more axes, such as, for example but not limited to that shown in FIGS. 3 to 7. This partially holds the grid firmly by spring tension. Additionally, the slots can also taper in width. The further the grid is inserted, the greater the curvature that can placed on the grid, and hence the tighter the grid is held. Grids of differing rigidity, or stiffness, or thickness are accommodated by inserting the grid into different depths into the holder. Stiff grids can be wedged into place with no discernable bending of the grid.
3. The grid is held only on the edges and backside near the edges, in one embodiment, and is not touched in the slot on the specimen side or face of the grid, and only very close to the edge of the grid on the obverse side of the grid. Thus, both grid sides or faces are provided with free media access
4. Multiple grids may be held without slots that completely encircle or surround each grid.
5. The grid slots can closed at the bottom for storage or other purposes. See FIGS. 3 to 6, 8 and 9.
6. The grid slots can be open at the bottom, such as for example but limited to that shown in FIGS. 10 to 18, and 21-25 to enable flow through for processing with stains or other purposes.
7. The holding slots may be made in any desired material, including polymers, metals, or ceramics. There is no need for an elastomer to grip the grids, nor an adhesive. Thus, chemically resistant materials may be readily used.
8. Slots may be made from injection-molded polymers such as polypropylene or polyethylene for easy of mass fabrication, and for good chemical resistance. While not true elastomers, these materials can exert some pressure on the grids to better hold them in place. Thus, the slot provides some of the tension to hold the grid, rather than the grid providing the tension. (Slots can be made of many other materials including, but limiting to, fluoropolymers, other thermoplastic polymers, thermoset polymers, metals, injection molded metals, and ceramics.)
9. This new type of holding slot is readily manufactured in high quantity and quality by injection molding and other molding and casting processes
10. The slots can hold electron microscope grids.
11. The slots can hold apertures.
12. The slots can hold many other items of similar shape including metal plates, foils, disks and other items where the combination of features provided is useful or advantageous.
13. Chemical etching of grids or specimens on grids used with capsules (FIGS. 21 to 24). These capsules may be made of fluorinated polymers or similar materials.
14. Metals, injection molded metals, or other electrically conductive materials would be used for FIB type holders (FIGS. 25 to 28).
15. Grids can be held in a FIB type holder (FIGS. 26 to 30) that can be used to hold grids prior to use, for storage after use, during FIB processing, during other specimen processing, and during microscopic analysis, such that grids may never need to be removed from the holder.
16. Any of the grid holder devices may be made of low thermal mass materials, and of very low mass, to increase cooling, or heating, rates.
17. Devices such as capsules and box holders may have covers for storage, cleanliness, to reduce exposure to temperatures, humidity, and to other environmental conditions.
18. Grids may be held in the grid holder by having a very slight bend, or visually no bend at all, being simply wedged in place with the visually imperceptible deformation of either the grid itself or the grid holder or both cooperating to hold the grid in place. The extent of deformation of the grids shown herein is illustrative only and it is not intended to suggest that the present disclosure be limited to such dramatic and/or visible deformations of the grid.
19. Grids may be held by only pinching from the very edges. The slots can be shorter than the diameter or the radius of the grids themselves.

While the invention has been described with reference to preferred embodiments, it is to be understood that the invention is not intended to be limited to the specific embodiments set forth above. Thus, it is recognized that those skilled in the art will appreciate that certain substitutions, alterations, modifications, and omissions may be made without departing from the spirit or intent of the invention. Accordingly, the foregoing description is meant to be exemplary only, the invention is to be taken as including all reasonable equivalents to the subject matter of the invention, and should not limit the scope of the invention set forth in the following claims.

What is claimed is:

1. A grid holder for retaining a specimen grid, the grid holder comprising:
a body sized to hold one or more specimen grids, the body comprising a slot in its interior, the slot including sides for receiving the specimen grid, wherein the specimen grid is a flat disk or a partial disk with edges and a pair of opposing faces, wherein one face of the specimen grid optionally has a specimen thereon;
wherein the slot is sized to receive the specimen grid through an open top end of the slot, the slot having sides tapering from the top end to a bottom end of the slot, such that the bottom end of the slot is smaller than the specimen grid; and
wherein the slot further is configured to contact the specimen grid along at least a portion of edges of the specimen grid to secure the specimen grid by engagement of the edges of the specimen grid with the sides of the slot, wherein the opposing faces of the grid do not contact the slot.

2. The grid holder of claim 1, wherein the grid is made of a resilient deformable material and the interior of the slot is configured to deflect the grid sideways as the grid is inserted into the slot, so that the grid exerts tension against the interior of the slot to hold the grid within the slot.

3. The grid holder of claim 1, wherein the bottom of the slot is closed.

4. The grid holder of claim 1, wherein the bottom of the slot is open.

5. The grid holder of claim 4, wherein the slot is configured to permit the exposure of the grid within the slot to one or more reagents, chemical treatments, preparation compounds or treatment environments to prepare any specimen held on the grid for examination.

6. The grid holder of claim 4, wherein the body is made of a chemically resistant material.

7. The grid holder of claim 1, wherein the body of the grid holder is made of a resilient deformable material and the material within the slot deflects in response to the insertion of the grid and exerts tension on the grid to retain the grid within the slot.

8. The grid holder of claim 1, wherein the slot is sized to so that insertion of the grid into the slot causes the grid to deflect and a resistance to deflection of the grid exerts tension on the sides of the slot to hold the grid within the slot, the slot further being configured so that deformation of the grid does not bring areas of the side of the grid that are distant from the edge into contact with the grid holder.

9. The grid holder of claim 1, wherein the grid is an electron microscope grid.

10. The grid holder of claim 4, wherein the grid is an electron microscope grid.

11. The grid holder of claim 1, the body further comprising a plurality of slots.

12. The grid holder of claim 1, further comprising the grid holder being made of a suitable material to retain the grid for processing, storage and analysis of a specimen on the grid, so that a grid need not be removed from the grid holder once placed in the slot.

13. The grid holder of claim 1, further comprising a cap configured to close off the open top of the slot.

14. The grid holder of claim 13, the cap further comprising a tab configured to extend into the slot and maintain the grid in position within the slot when the cap is closing off the open top of the slot.

15. The grid holder of claim 13, wherein the cap is attached to the grid holder by a living hinge.

16. The grid holder of claim 1, wherein the grid holder includes a plurality of slots and indicia are included corresponding to each slot.

17. A device for retaining a thin aperture, the device comprising:
a body sized to hold one or more thin apertures, the body comprising a slot in its interior, the slot including sides for receiving the thin aperture, wherein the thin aperture is a flat disk with edges and a pair of opposing faces;
wherein the slot is sized to receive the thin aperture through an open top end of the slot, the slot having dies tapering from the top end to a bottom end of the slot, such that the bottom end of the slot is smaller than the thin aperture; and
wherein the slot is configured to contact the thin aperture along at least a portion of the edges of the thin aperture to secure the thin aperture to allow sideways deformation of the aperture without opposing faces of the thin aperture contacting the slot.

18. The device of claim 17, wherein the grid is made of a resilient deformable material and insertion of the grid within the slot causes the grid to deform and exert pressure against the opposing sides of the slot along opposing edges of the grid.

19. The device of claim 17, wherein the body is mode of a resilient deformable material and insertion of the grid within the slot causes the opposing sides of the slot to deform and exert pressure on the opposing edges of the grid to secure the grid with the slot.

20. A device for retaining a thin disk, the device comprising:
a body sized to hold one or more thin disks, the body comprising a slot formed in its interior, the slot including sides for receiving the thin disk, wherein the thin disk has edges and a pair of opposing sides and is made of a resilient deformable material;
wherein the slot is sized to receive the thin disk through an open top end of the slot, the slot having sides tapering from the top end to a bottom end of the slot, such that the bottom end of the slot is smaller than the thin disk; and
wherein the slot is configured to contact the thin disk along at least a portion of the edges of the disk and to allow sideways deformation of the disk without opposing faces of the thin disk contacting the slot.

21. The grid holder of claim 1, wherein the body of the grid holder is a capsule and the slot is formed in the interior of the capsule.

22. The grid holder of claim 1, wherein the grid holder comprises a plurality of slots within the body of the grid holder for holding a plurality of sample grids.

\* \* \* \* \*